(12) United States Patent
Kim

(10) Patent No.: US 7,951,713 B2
(45) Date of Patent: May 31, 2011

(54) METHOD OF FORMING METAL WIRING IN SEMICONDUCTOR DEVICE

(75) Inventor: Wan-Shick Kim, Gyeonggi-do (KR)

(73) Assignee: Dongbu HiTek Co., Ltd., Seoul (KR)

( * ) Notice: Subject to any disclaimer, the term of this patent is extended or adjusted under 35 U.S.C. 154(b) by 565 days.

(21) Appl. No.: 11/935,974

(22) Filed: Nov. 6, 2007

(65) Prior Publication Data
US 2008/0122097 A1 May 29, 2008

(30) Foreign Application Priority Data
Nov. 27, 2006 (KR) .................. 10-2006-0117377

(51) Int. Cl.
*H01L 23/16* (2006.01)
(52) U.S. Cl. ........................... 438/683; 438/685
(58) Field of Classification Search .................. 257/750, 257/758, 763, 765, 771; 438/683, 685
See application file for complete search history.

(56) References Cited

U.S. PATENT DOCUMENTS
6,320,243 B1 * 11/2001 Jeong et al. .................... 257/529
2003/0155844 A1 * 8/2003 Anasako ....................... 310/364

FOREIGN PATENT DOCUMENTS
KR 1999-0065642 8/1999
KR 1020020028301 A 4/2002

* cited by examiner

*Primary Examiner* — Leonardo Andújar
(74) *Attorney, Agent, or Firm* — Sherr & Vaughn, PLLC

(57) ABSTRACT

A method for forming a metal wiring of a semiconductor device capable of efficiently preventing a hillock phenomenon occurred in a subsequent annealing process of a metal wiring process. The method for forming a metal wiring of a semiconductor device includes forming an Al growth stop film on the upper interface of an Al wiring film by reacting implanted reactive ions with a Ti film or the Al in the Al wiring film.

7 Claims, 5 Drawing Sheets

METHOD OF FORMING METAL WIRING IN SEMICONDUCTOR DEVICE

The present application claims priority under 35 U.S.C. 119 to Korean Patent Application No. 10-2006-0117377 (filed on Nov. 27, 2006), which is hereby incorporated by reference in its entirety.

BACKGROUND

Aspects of semiconductor technology has focused high-speed semiconductor devices having enhanced storage capacities for various applications. In order to obtain such qualities, enhanced integration, response speed and metal wiring processing of semiconductor devices has been developed.

Metal wiring processing may require the implementation of the paths of power supply and signal transfer constituting a circuit by interconnecting individual transistors in a semiconductor integrated circuit on and/or over silicon. A non-memory device has led the technique in this field.

The metal wiring layer of a semiconductor device may be formed of copper, tungsten, aluminum or any alloys thereof. The metal wiring layer may function as a contact with devices, an interconnection therebetween, and a connection between a chip and an external circuit, etc.

Integration of semiconductor devices has increased, and the size of metal wiring has become small so that the wiring can be formed by expanding the thickness of the metal wiring in order to secure the resistance of the metal wiring.

Figure 1:
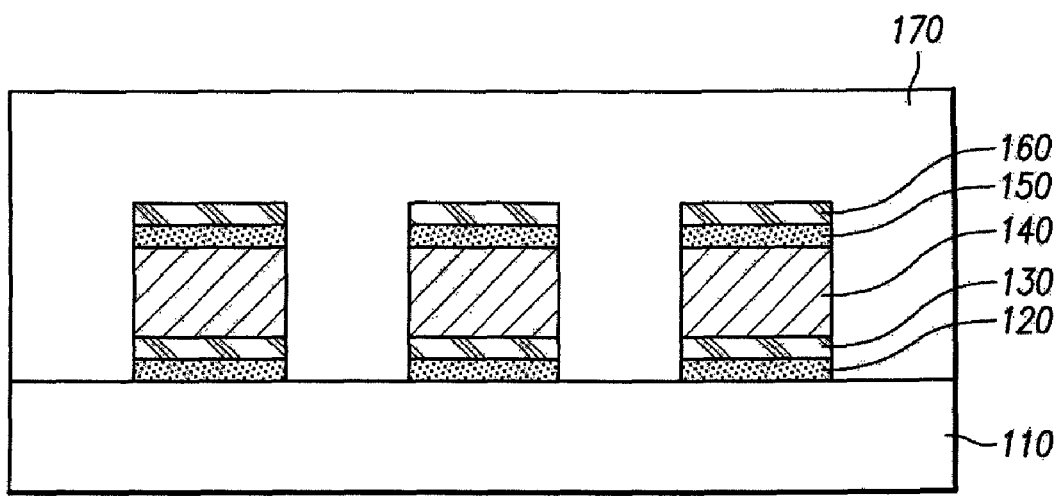

As illustrated in example FIG. 1, first Ti film 120 and first TiN film 130 may be deposited on and/or over lower insulating interlayer 110 of a semiconductor substrate provided with a predetermined lower structure using a sputtering method. Al film 140 can be formed on and/or over TiN film 130. Second Ti film 150 and second TiN film 160 can then be sequentially deposited.

Thereafter, a photoresist can be applied and patterned on and/or over second TiN film 160 to form a predetermined pattern. Thereafter, a dry etching process using the pattern can be performed on the Al wiring stacked structure including a multi-layer film formed of first Ti film 120 and first TiN film 130 formed under Al film 140, and second Ti film 150 and second TiN film 160 formed on and/or over Al film 140.

Upper dielectric interlayer 170 can be formed for insulating between the plurality of Al wiring stacked structure patterns formed using an etching process.

When depositing Al film 140 using a sputtering method, the temperature can be gradually increased in order to lower resistance and to reinforce electro migration (EM) characteristics by enlarging the size of the metal grain. Accordingly, a grain boundary can be enlarged to an extent that the size of the metal grain enlarges, and in particular, the recession of the grain boundary also enlarges at a triple point as the thickness of Al becomes thicker.

If a subsequent annealing process is performed in such a state, the Al moves along the grain boundary to form a hillock on the surface and grows in order to solve the stress due to the difference of thermal expansion coefficient between the Al and Si used as a semiconductor substrate.

In order to prevent such a phenomenon, Ti/Tin has been formed on and/or over the Al. The film capable of preventing a hillock phenomenon is TiN. However, if the TiN film is formed too thick, it may lower the resistance of the wiring. Therefore, there is a restriction on the expansion of the thickness of the TiN for preventing the hillock phenomenon.

SUMMARY

Embodiments relate to a method for forming a metal wiring of a semiconductor device capable of efficiently preventing a hillock phenomenon occurred in a subsequent annealing process of a metal wiring process.

Embodiments relate to a method for forming a metal wiring of a semiconductor device including at least one of the following steps: forming an interlayer insulating layer over a semiconductor substrate including a predetermined lower structure; forming an Al wiring stacked structure over the interlayer insulating layer, wherein the Al wiring structure is composed of a plurality of films including an Al wiring film and a first Ti-based film formed over the Al wiring film; forming an Al growth stop film at an interface between the Al wiring film and the first Ti-based film; and then forming a plurality of Al wiring stacked structure patterns over the interlayer insulating layer.

Embodiments relate to a method for forming a metal wiring of a semiconductor device including at least one of the following steps: forming an interlayer insulating layer over a semiconductor substrate including a predetermined lower structure; forming an Al wiring stacked structure over the interlayer insulating layer, wherein the Al wiring structure is composed of a plurality of films including an Al wiring film and a first Ti-based film formed over the Al wiring film; forming a plurality of Al wiring stacked structure patterns on the interlayer insulating layer; and then forming an Al growth stop film at an interface between the Al wiring film and the first Ti-based film.

Embodiments relate to a metal wiring structure for a semiconductor device including an interlayer insulating layer formed over a semiconductor substrate; a plurality of Al wiring stacked structure patterns formed on the interlayer insulating layer. In accordance with embodiments, the plurality of Al wiring stacked structure patterns is composed of a plurality of films including an Al wiring film, a first Ti-based film formed over the Al wiring film and an Al growth stop film formed between the Al wiring film and the first Ti-based film.

DRAWINGS

Example FIG. 1 illustrates a method for forming a metal wiring of a semiconductor device.

Example FIGS. 2 to 5 illustrate a method for forming a metal wiring of a semiconductor device, in accordance with embodiments.

DESCRIPTION

Figure 2A:
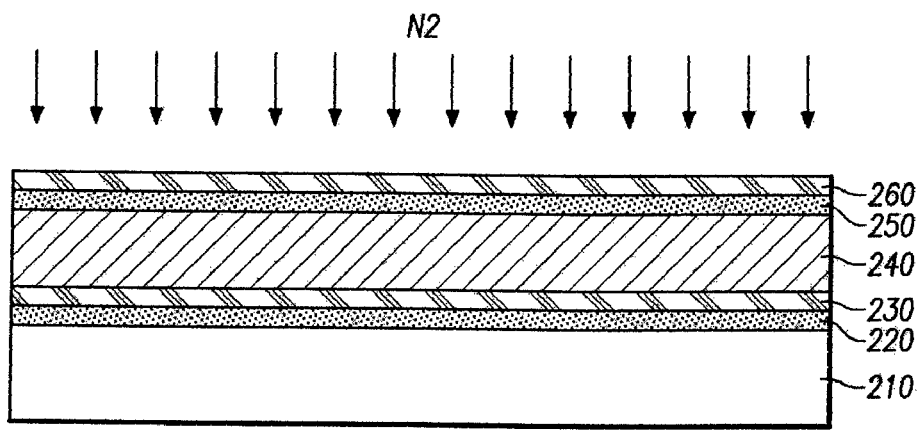

As illustrated in example FIG. 2A, first interlayer insulating layer 210 can be formed on and/or over a semiconductor substrate having a predetermined lower structure. First Ti film 220 and first TiN film 230 can be sequentially formed on and/or over first interlayer insulating layer 210. First metal wiring 240, which can be composed of aluminum (Al), can be provided over first TiN film 230. Second Ti film 250 and second TiN film 260 can be sequentially formed on and/or over first interlayer insulating layer 210 including first Al wiring 240 to form an Al stacked structure having a plurality of films. A sputtering method can be used in order to deposit the plurality of films and wiring.

Nitride ions may be implanted in the semiconductor substrate including the Al wiring stacked structure provided with the plurality of films. The nitride ions can serve as reactive ions implanted into an interface between first Al wiring 240 and second Ti film 250 using an ion implantation method.

Figure 2B:
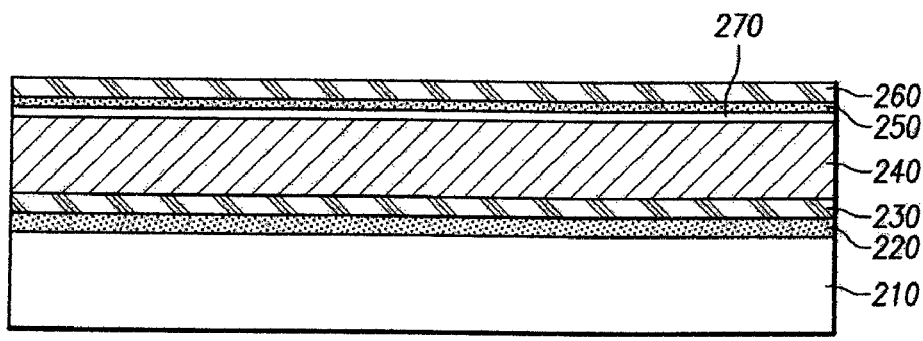

As illustrated in example FIG. 2B, the implanted nitride ions react with second Ti film 250 in the interface between first Al wiring 240 and second Ti film 250 to form first Al growth stop film 270 thinly and finely formed of TiN between first Al wiring 240 and second Ti film 250.

First Al growth stop layer 270 can serve to suppress movement of Al in the first Al wiring 240, which in turn prevents hillock formation due to a subsequent annealing on the Al wiring stacked structure.

First Al growth stop film 270 may be formed by directly forming a growth stop film composed of at least one of TiN and $Al_2O_3$ on and/or over the Al wiring. However, if first Al growth stop film 270 is formed using a deposition process or an oxidation process, it may become difficult to control the thickness of the film, which in turn, may increase wire resistance.

Accordingly, in accordance with embodiments, after formation of the Al wiring stacked structure provided with a plurality of films, the ion implantation method using nitride ions or oxygen ions can be used. Then, the reactive ions can be implanted and reacted at a desired position to form first Al growth stop film 270. Therefore, deterioration of the reliability of the semiconductor device due to hillock formation occurrence can be prevented, while also minimizing the deterioration of the wiring characteristics.

Figure 2C:
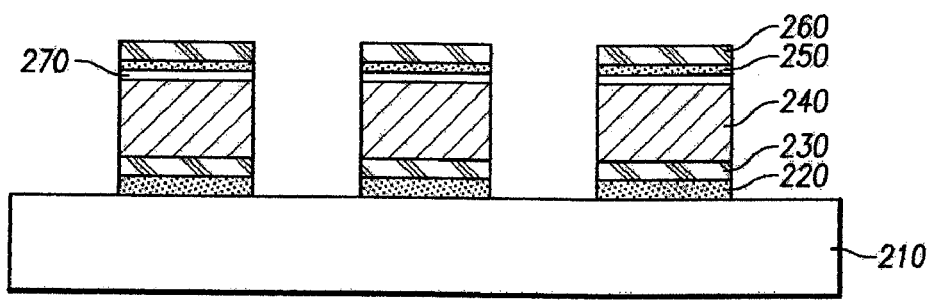

As illustrated in example FIG. 2C, in order to form a plurality of Al wiring stacked structure patterns on and/or over first interlayer insulating layer 210, a dry etching can be performed on the Al wiring stacked structure including first Al growth stop film 270 formed of TiN. Thereafter, a predetermined semiconductor device is implemented by performing a subsequent process such as an annealing, etc.

Figure 3A:
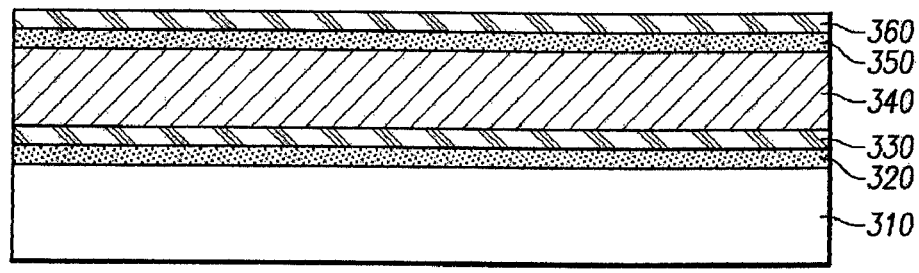

As illustrated in example FIG. 3A, second interlayer insulating layer 310 can be formed on and/or over a semiconductor substrate having a predetermined lower structure. Third Ti film 320 and third TiN film 330 can be sequentially formed on and/or over second interlayer insulating layer 310. Second metal wiring 340, which can be composed of aluminum (Al), can be provided over second TiN film 330. Fourth Ti film 350 and fourth TiN film 360 can be sequentially formed on and/or over second interlayer insulating layer 310 including second Al wiring 340 to form an Al stacked structure having a plurality of films. A sputtering method can be used as the mode of deposition of the films and wiring.

Figure 3B:
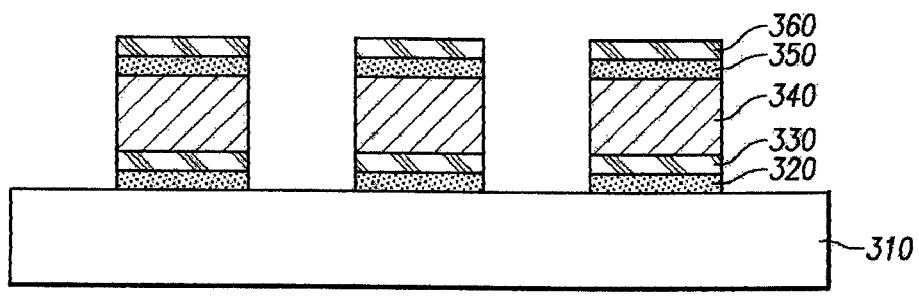

As illustrated in example FIG. 3B, a dry etching can be performed on the Al wiring stacked structure to form a plurality of Al wiring stacked structure patterns on and/or over second interlayer insulating layer 310.

Figure 3C:
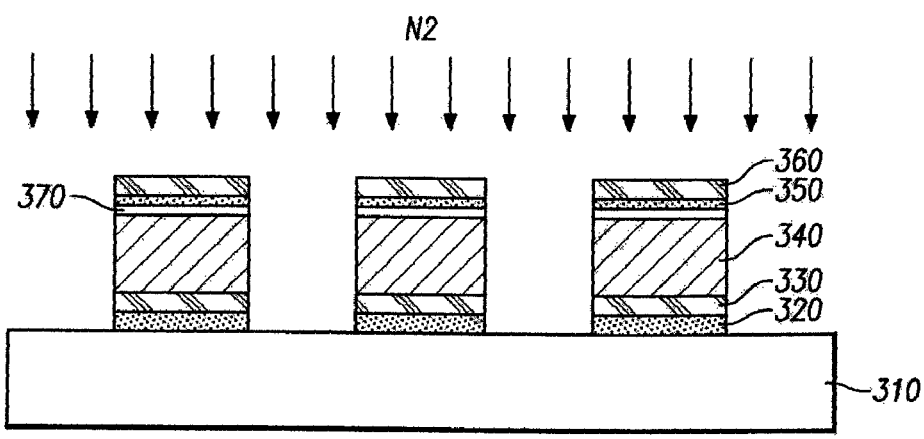

As illustrated in example FIG. 3C, an ion implantation method can then be used to implant nitride ions as reactive ions into the interface between second Al wiring 340 pattern and fourth Ti film 350 of each Al wiring stacked structure pattern.

The implanted nitride ions can react in the interface between second Al wiring 340 and fourth Ti film 350 to form second Al growth stop film 370 therebetween.

Figure 4A:
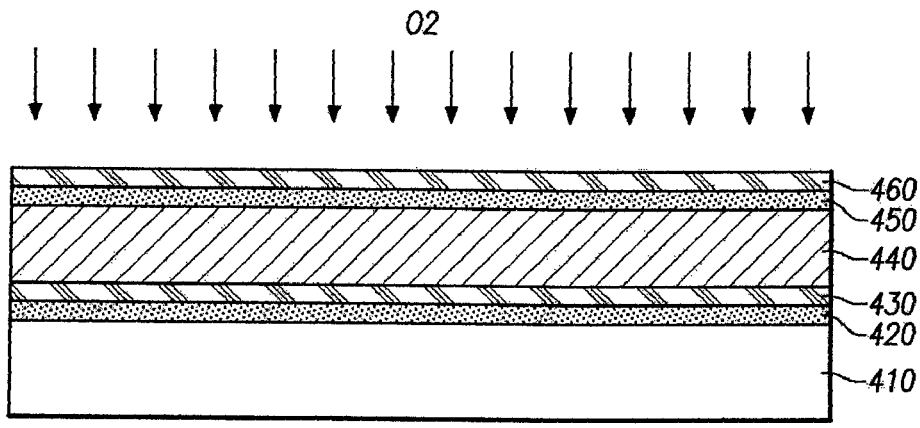

As illustrated in example FIG. 4A, third interlayer insulating layer 410 can be formed on and/or over a semiconductor substrate having a predetermined lower structure. Fifth Ti film 420 and fifth TiN film 430 can be sequentially formed on and/or over third interlayer insulating layer 310. Third metal wiring 440, which can be composed of aluminum (Al), can be provided over fifth TiN film 430. Sixth Ti film 350 and sixth TiN film 360 can be sequentially formed on and/or over third interlayer insulating layer 410 including third Al wiring 340 to form an Al stacked structure having a plurality of films. A sputtering method can be used as the mode of deposition of the films and wiring.

After formation of the Al wiring stacked structure an ion implantation method can then be used to implant oxygen ions as reactive ions into the interface between third Al wiring 440 pattern and sixth Ti film 450. Alternatively, an ion implantation method implanting nitride ions as reactive ions into the interface between third Al wiring 440 pattern and sixth Ti film 450 may be used.

Figure 4B:
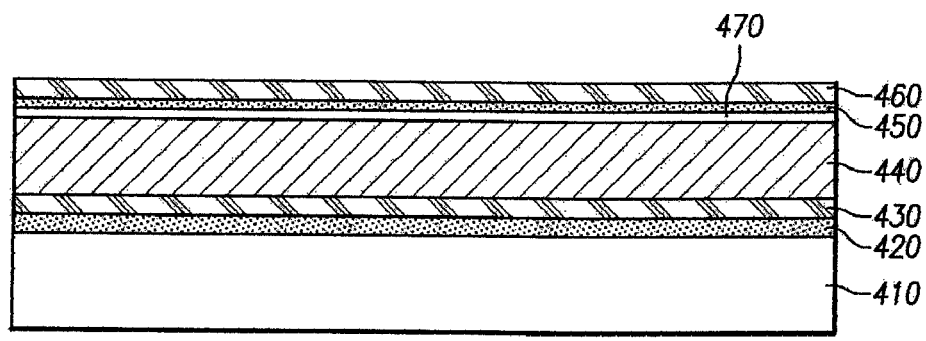

As illustrated in example FIG. 4B, the implanted oxygen ions react with the Al in third Al wiring 440 to form a thin layer of third Al growth stop film 470 composed of $Al_2O_3$ between third Al wiring 440 pattern and sixth Ti film 450. Third Al growth stop layer 470 can suppress movement of Al, making it possible to prevent hillock formation during subsequent annealing on the Al wiring stacked structure. Deterioration of the wiring characteristics can also be reduced.

Figure 4C:
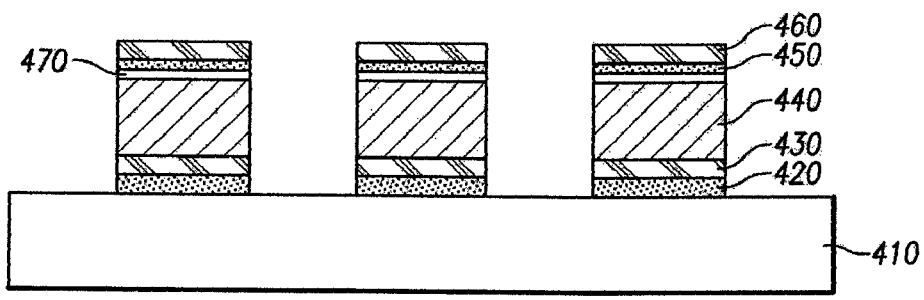

As illustrated in example FIG. 4C, a dry etching can be performed on the resultant Al wiring stacked structure including third Al growth stop film 470 to form a plurality of Al wiring stacked structure patterns on and/or over third interlayer insulating layer 410.

Figure 5A:
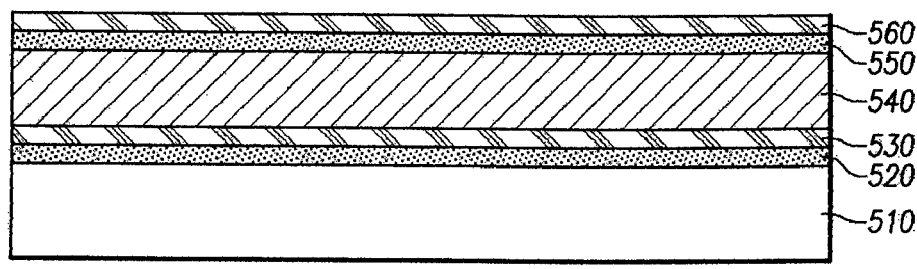

As illustrated in example FIG. 5A, Seventh Ti film 520, seventh TiN film 530, fourth Al wiring 540, eighth Ti film 550 and eighth TiN film 560 can be sequentially formed on and/or fourth interlayer insulating layer 510. Fourth interlayer insulating layer 510 can be formed on and/or over a semiconductor substrate having a predetermined lower structure. Seventh Ti film 520 and seventh TiN film 530 can be formed on and/or over fourth interlayer insulating layer 410. Fourth metal wiring 540, which can be composed of aluminum (Al), can be provided over seventh TiN film 530. Eighth Ti film 550 and eighth TiN film 560 can be formed on and/or over fourth interlayer insulating layer 510 including fourth Al wiring 540 to form an Al stacked structure having a plurality of films. A sputtering method can be used as the mode of deposition of the films and wiring.

Figure 5B:
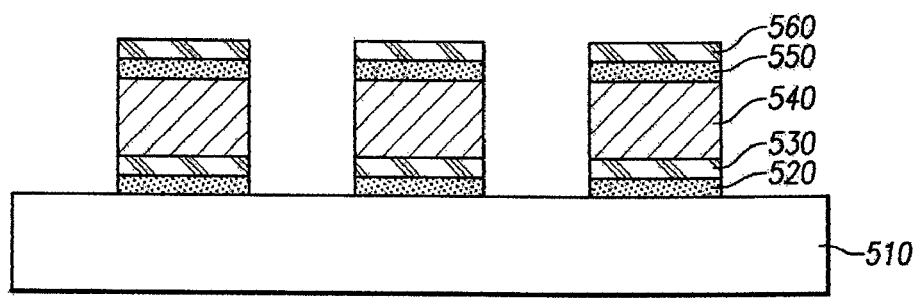

As illustrated in example FIG. 5B, a dry etching can be performed on the Al wiring stacked structure to form a plurality of Al wiring stacked structure patterns on and/or over fourth interlayer insulating layer 510.

Figure 5C:
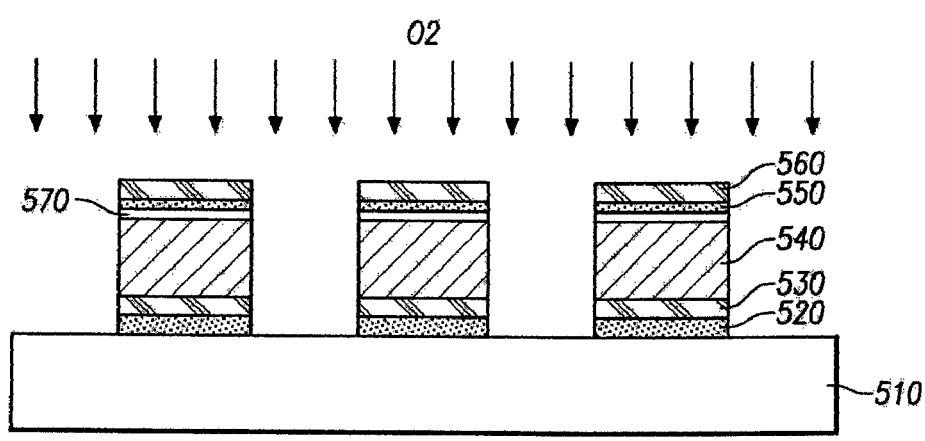

As illustrated in example FIG. 5C, an ion implantation method can then be performed to implant oxygen ions as reactive ions into the interface between fourth Al wiring 540 pattern and eighth Ti film 550 of each Al wiring stacked structure pattern.

The implanted oxygen ions react at the interface between fourth Al wiring 540 and eighth Ti film 550 to form fourth Al growth stop film 570 pattern therebetween. Fourth Al growth stop film 570 can be composed of $Al_2O_3$.

In accordance with embodiments, a method of forming a metal wiring structure whereby after formation of the Al wiring stacked structure, nitride or oxygen ions can be implanted into an interface between the Al wiring and a Ti film to react with the Ti film or the Al wiring. These reactions prevent formation of hillocks during subsequent annealing processing. In particular, such embodiments provide an Al growth stop film composed of at least one of TiN and $Al_2O_3$ between the Al wiring and the TiN film to suppress movement of the Al, thereby enhancing the reliability of a semiconductor device.

Although embodiments have been described herein, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A method comprising:
    forming an interlayer insulating layer over a semiconductor substrate including a predetermined lower structure;
    forming an Al wiring stacked structure over the interlayer insulating layer, wherein the Al wiring structure is composed of a plurality of films including an Al wiring film and a first Ti-based film formed over the Al wiring film;
    forming an Al growth stop film at an interface between the Al wiring film and the first Ti-based film; and then
    forming a plurality of Al wiring stacked structure patterns over the interlayer insulating layer,
    wherein the plurality of Al wiring stacked structure patterns is formed using a dry etching process and the Al growth stop film is formed using an ion implantation method.

2. The method of claim 1, wherein the ion implantation method includes implanting reactive ions at the interface between the Al wiring film and the second Ti-based film.

3. The method of claim 2, wherein the reactive ions comprise nitride ions.

4. The method of claim 3, wherein the Al growth stop film comprises TiN.

5. The method of claim 4, wherein the Al growth stop film comprises $Al_2O_3$.

6. The method of claim 2, wherein the reactive ions comprise oxygen ions.

7. A method comprising:
    forming an interlayer insulating layer over a semiconductor substrate including a predetermined lower structure;
    forming an Al wiring stacked structure over the interlayer insulating layer, wherein the Al wiring structure is composed of a plurality of films including an Al wiring film, a first Ti-based film formed over the Al wiring film, second and third Ti-based films formed between the Al wiring film and the interlayer insulating layer, and a fourth Ti-based film formed over the first Ti-based film;
    forming an Al growth stop film at an interface between the Al wiring film and the first Ti-based film; and then
    forming a plurality of Al wiring stacked structure patterns over the interlayer insulating layer,
    wherein the first and third Ti-based films comprise Ti films and the second and fourth Ti-based comprises TiN films.

* * * * *